United States Patent
Yeh et al.

(10) Patent No.: US 8,460,014 B2
(45) Date of Patent: Jun. 11, 2013

(54) ELECTRONIC DEVICE AND PIN THEREOF

(75) Inventors: Chang-Hsing Yeh, Taoyuan County (TW); Wei-Chun Tsai, Taoyuan County (TW)

(73) Assignee: Nan Ya PCB Corp., Taoyuan County (TW)

( * ) Notice: Subject to any disclaimer, the term of this patent is extended or adjusted under 35 U.S.C. 154(b) by 0 days.

(21) Appl. No.: 13/283,482

(22) Filed: Oct. 27, 2011

(65) Prior Publication Data
US 2013/0017740 A1    Jan. 17, 2013

(30) Foreign Application Priority Data
Jul. 14, 2011  (TW) .............................. 100124880 A

(51) Int. Cl.
*H01R 12/00* (2006.01)
(52) U.S. Cl.
USPC .......................................................... 439/83
(58) Field of Classification Search
USPC ........ 439/870, 862, 82, 83, 857, 876; 29/843; 174/260, 267
See application file for complete search history.

(56) References Cited

U.S. PATENT DOCUMENTS

| | | | | |
|---|---|---|---|---|
| 4,017,142 A * | 4/1977 | Clark et al. | ................... | 439/870 |
| 4,735,575 A * | 4/1988 | Shaffer | ........................... | 439/82 |
| 4,752,250 A * | 6/1988 | Seidler | ........................... | 439/751 |
| 5,135,403 A * | 8/1992 | Rinaldi | ........................... | 439/82 |
| 5,451,174 A * | 9/1995 | Bogursky et al. | ............. | 439/876 |
| 5,497,546 A * | 3/1996 | Kubo et al. | ..................... | 29/843 |
| 5,766,045 A * | 6/1998 | Sawaki et al. | .................. | 439/857 |
| 6,011,222 A * | 1/2000 | Sekiya et al. | .................. | 174/266 |
| 6,168,441 B1 * | 1/2001 | Buchart | ........................ | 439/82 |
| 6,552,277 B1 * | 4/2003 | Downes | ........................ | 174/267 |
| 6,623,283 B1 * | 9/2003 | Torigian et al. | ................. | 439/83 |
| 6,848,952 B2 * | 2/2005 | Norris | ............................. | 439/751 |
| 6,997,757 B2 * | 2/2006 | Roshardt | ....................... | 439/751 |
| 7,347,750 B2 * | 3/2008 | Cachina et al. | ............... | 439/876 |
| 7,485,017 B2 * | 2/2009 | Pang et al. | ..................... | 439/876 |
| 7,723,620 B2 * | 5/2010 | Kawade et al. | ................ | 174/267 |
| 7,893,355 B2 * | 2/2011 | Oh et al. | ..................... | 174/94 R |
| 8,153,900 B2 * | 4/2012 | Takeuchi et al. | ........... | 174/126.1 |
| 2002/0117330 A1 * | 8/2002 | Eldridge et al. | .............. | 174/260 |
| 2004/0259434 A1 * | 12/2004 | Pitzele | .......................... | 439/884 |
| 2008/0009155 A1 * | 1/2008 | Ide et al. | ......................... | 439/83 |
| 2010/0000761 A1 * | 1/2010 | Oh et al. | ..................... | 174/126.1 |
| 2011/0068473 A1 * | 3/2011 | Lee et al. | ....................... | 257/773 |

* cited by examiner

*Primary Examiner* — Alexander Gilman

(57) ABSTRACT

An electronic device is provided. The electronic device includes a substrate, a plurality of electrodes, a soldering material and a plurality of pins. The electrodes are formed in the substrate. The soldering material is disposed on the electrodes. The pins contact the soldering material and electrically connect to the electrodes, wherein at least one of the pins includes a post and a base. The post has a fixing end. The base is disposed on the fixing end of the post, wherein a plurality of openings are formed on the base, passing through the base along an axis, and the axis is parallel to the post.

14 Claims, 8 Drawing Sheets

US 8,460,014 B2

ELECTRONIC DEVICE AND PIN THEREOF

CROSS REFERENCE TO RELATED APPLICATIONS

This Application claims priority of Taiwan Patent Application No. 100124880, filed on Jul. 14, 2011, the entirety of which is incorporated by reference herein.

BACKGROUND OF THE INVENTION

1. Field of the Invention

The present invention relates to an electronic device, and in particular relates to a semiconductor electronic device with pins.

2. Description of the Related Art

FIG. 1A shows a pin 10 of a conventional electronic device (for example, central processing unit), which includes a post 11 and a base 12. The base 12 has curved bottom surface. With reference to FIG. 1B, when the pin 10 is desired to be embedded into the substrate 20, the pin 10 is inserted in the soldering material 30 and contacts a conductive pad 40. Next, as shown in FIG. 1C, a reflow soldering process is applied to the electronic device to remove bubbles 31 from the soldering material 30. However, due to the reflow soldering process, the pin 10 often tilts.

BRIEF SUMMARY OF THE INVENTION

An electronic device is provided. The electronic device includes a substrate, a plurality of electrodes, a soldering material and a plurality of pins. The electrodes are formed in the substrate. The soldering material is disposed on the electrodes. The pins contact the soldering material and electrically connect to the electrodes, wherein at least one of the pins includes a post and a base. The post has a fixing end. The base is disposed on the fixing end of the post, wherein a plurality of openings are formed on the base, passing through the base along an axis, and the axis is parallel to the post.

The Applicant discovered that the tilting of the pin during the reflow soldering process is due to the pushing action of the bubbles. In the reflow soldering process, the bubbles are blocked by the base in the dissipation path, such that the bubbles push the pin with buoyancy.

In the embodiment of the invention, the bubbles in the soldering material are directly dispersed through the openings without being blocked by the base. Therefore, in the embodiments of the invention, the pin is prevented from being tilted.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
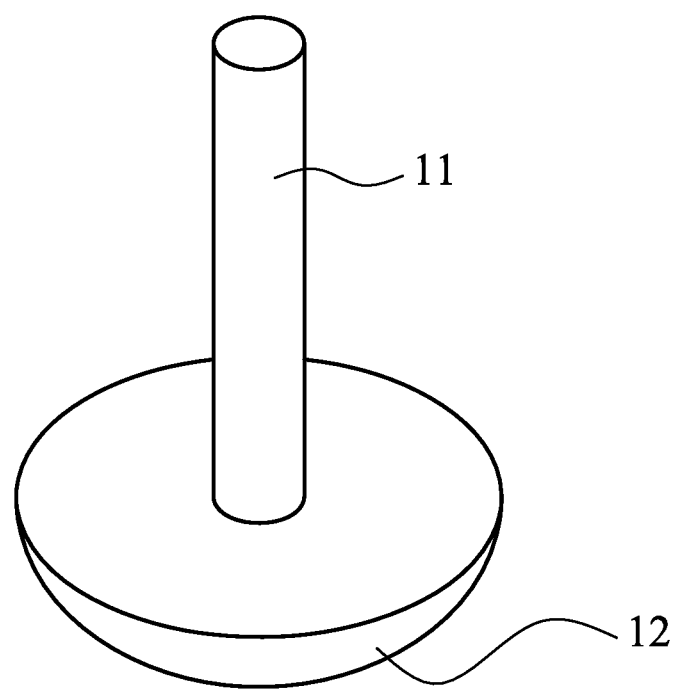
FIG. 1A shows a pin of a conventional electronic device.
Figure 1B:
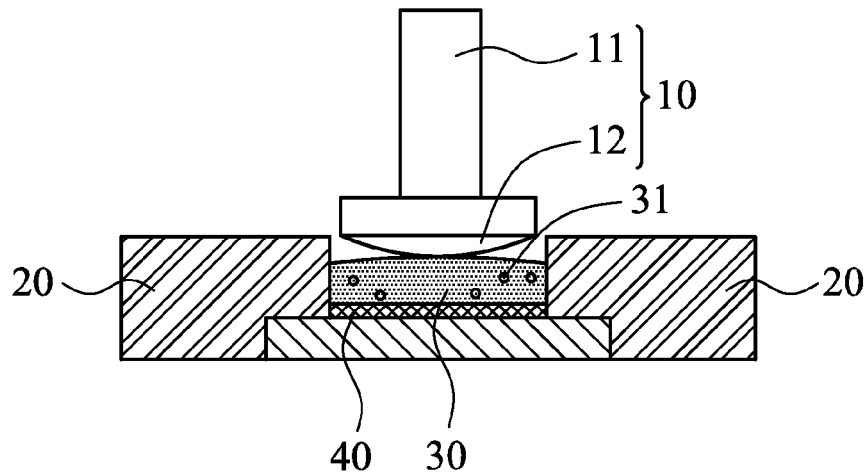
FIG. 1B shows an embedding process applied to the conventional pin.
Figure 1C:
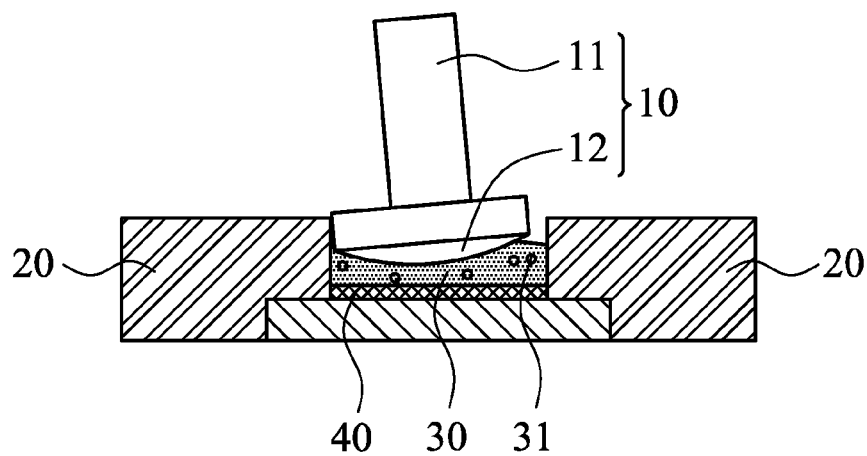
FIG. 1C shows the conventional pin, tilted, in a reflow soldering process.
Figure 2A:
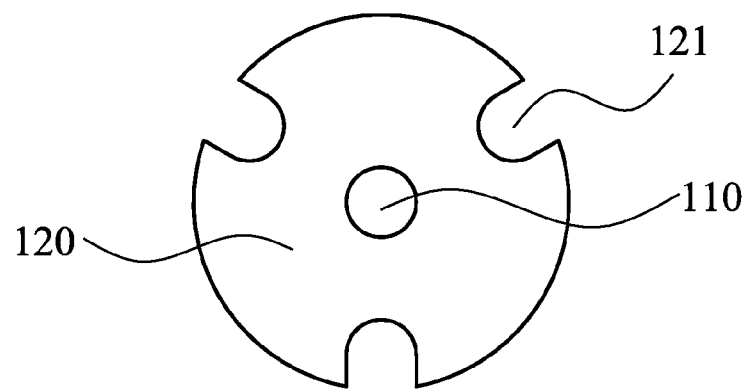
FIG. 2A is a top view of a pin of a first embodiment of the invention.
Figure 2B:
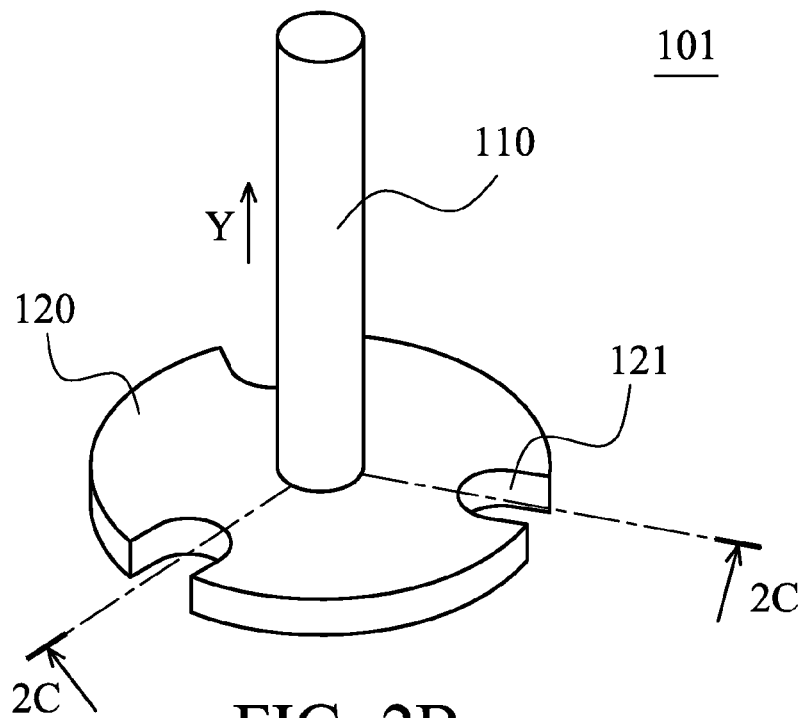
FIG. 2B is a perspective view of the pin of the first embodiment of the invention.

FIG. 2A is a top view of a pin 101 of a first embodiment of the invention. FIG. 2B is a perspective view of the pin 101 of the first embodiment of the invention. With reference to FIGS. 2A and 2B, the pin 101 of the first embodiment of the invention includes a post 110 and a base 120. The base 120 is disposed on a fixing end of the post 110. A plurality of openings 121 are formed on the base 120, passing through the base 120 along an axis Y, and the axis Y is parallel to the post 110. In this embodiment, the base 120 is a circular plate. The amount of the openings 121 is more than three. The openings 121 can be semicircular, U shaped or other shaped notches, and the openings 121 are equidistantly formed on edge of the base 120.

In the embodiments of the invention, the base 120 is circular. However, the invention is not limited. The base can also be rectangular, polygon or other shaped.

Figure 2C:
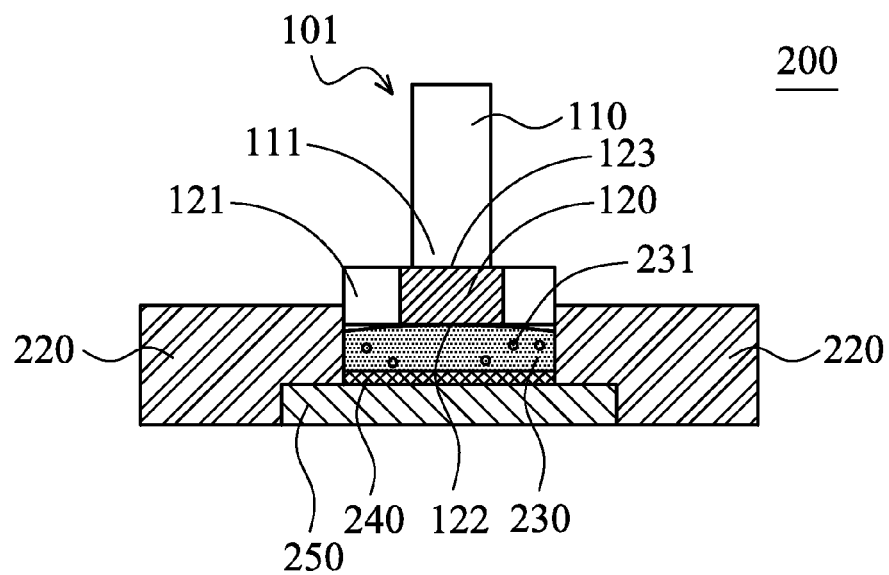
FIG. 2C shows an electronic device of the first embodiment of the invention, wherein an embedding process is applied to the pin.
Figure 2D:
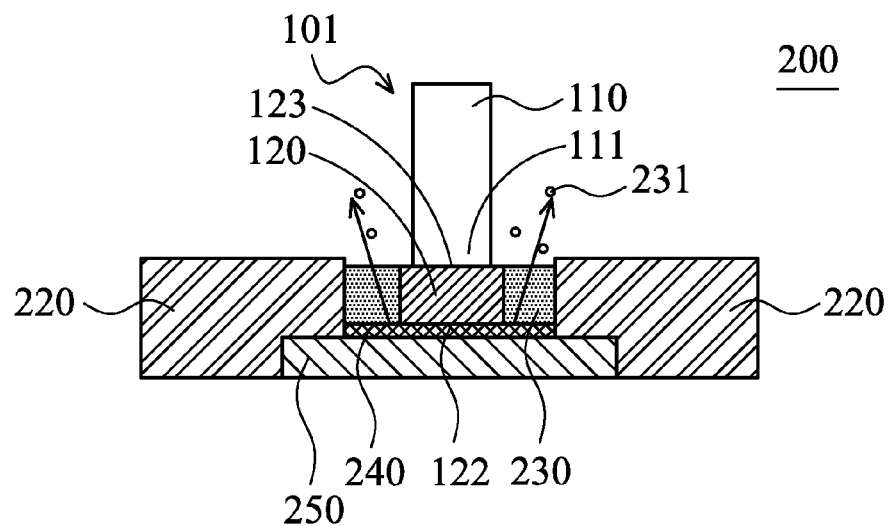
FIG. 2D shows a reflow soldering process is applied to the electronic device of the first embodiment of the invention.

FIG. 2C shows an electronic device 200 of the first embodiment of the invention, wherein an embedding process is applied to the pin 101. In FIG. 2C, the pin 101 is sectioned along direction 2C-2C of FIG. 2B. The electronic device 200 comprises a substrate 220, electrodes 250, a soldering material 230, a conductive pad 240 and pins 101. The electrodes 250 are disposed in the substrate 220. The conductive pad 240 is sandwiched between the electrode 250 and the soldering material 230. With reference to FIG. 2D, when the pin 101 of the first embodiment is embedded into the substrate 220. The pin 101 is inserted into the soldering material 230 and contacts the conductive pad 240 to be electrically connected to the electrode 250. The base 120 comprises a bottom surface 122 and a top surface 123. The fixing end 111 of the pin 110 is connected to the top surface 123. The bottom surface 122 contacts the conductive pad 240. The soldering material 230 passes through the openings 121 to contact the inner wall of the openings 121. In one embodiment, the soldering material 230 may overflow on the top surface 123 of the base 120.

The Applicant discovered that the tilting of the pin during the reflow soldering process is due to the pushing action of bubbles. In the reflow soldering process, the bubbles are blocked by the base in the dissipation path, and the bubbles push the pin with buoyancy.

With reference to FIG. 2D, in the embodiment of the invention, the bubbles 231 in the soldering material 230 are directly dispersed through the openings 121 without being blocked by the base 120. Therefore, in the embodiment of the invention, the pin 101 is prevented from being tilted.

Additionally, in the embodiment of the invention, the soldering material contacts the inner wall of the openings, such that the contact area between the pin and the soldering material is increased, and the connection between the pin, the conductive pad and the electrodes is improved.

Figure 3A:
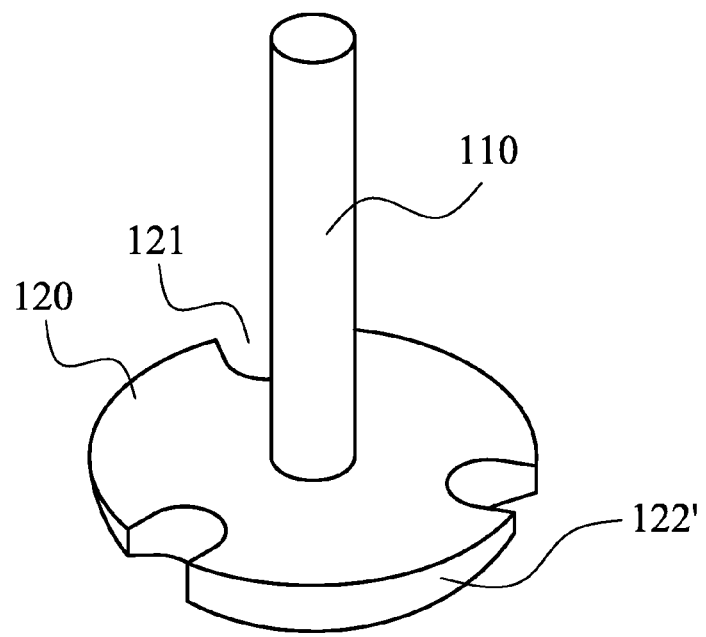
FIG. 3A shows a modified example of the pin of the first embodiment of the invention.
Figure 3B:
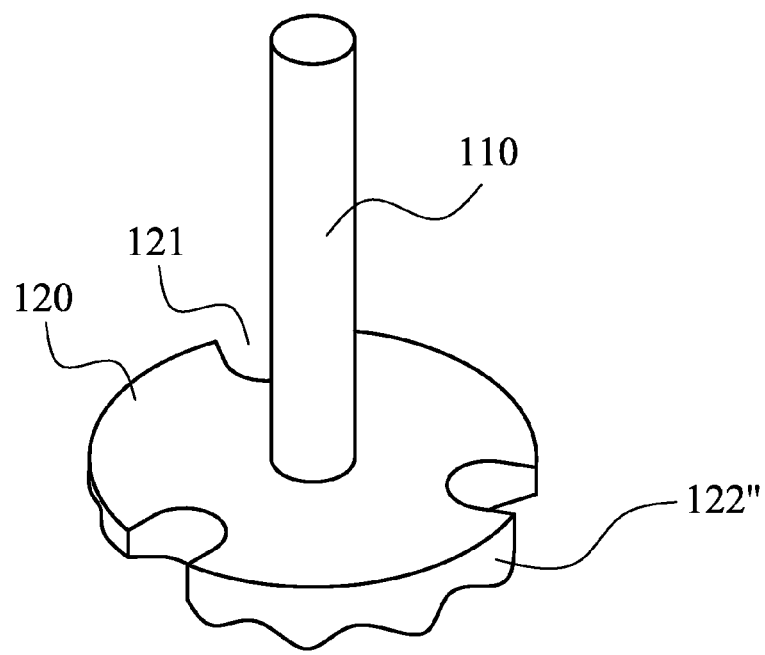
FIG. 3B shows another modified example of the pin of the first embodiment of the invention.

As shown in FIG. 3A, the bottom surface 122' can be a curved surface. As shown in FIG. 3B, the bottom surface 122" can also be an irregular surface. The shape of the bottom surface can be modified. However, no matter how variable the shapes are of the bottom surface, the openings 121 pass through the base along the axis Y.

Figure 4A:
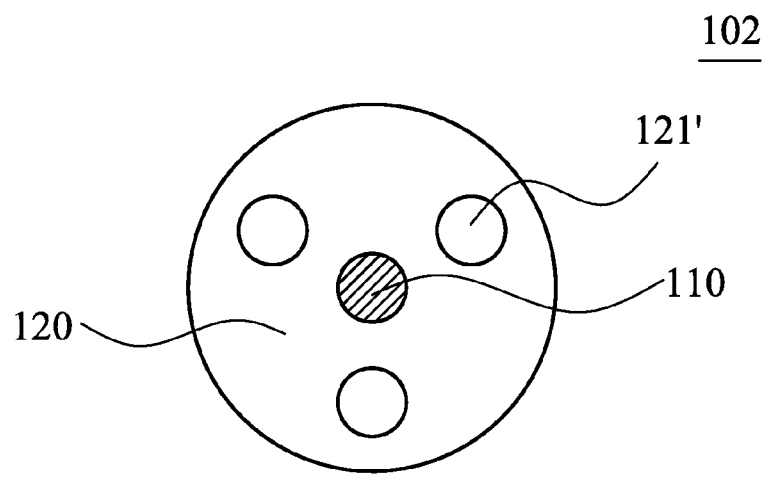
FIG. 4A is a top view of a pin of a second embodiment of the invention.
Figure 4B:
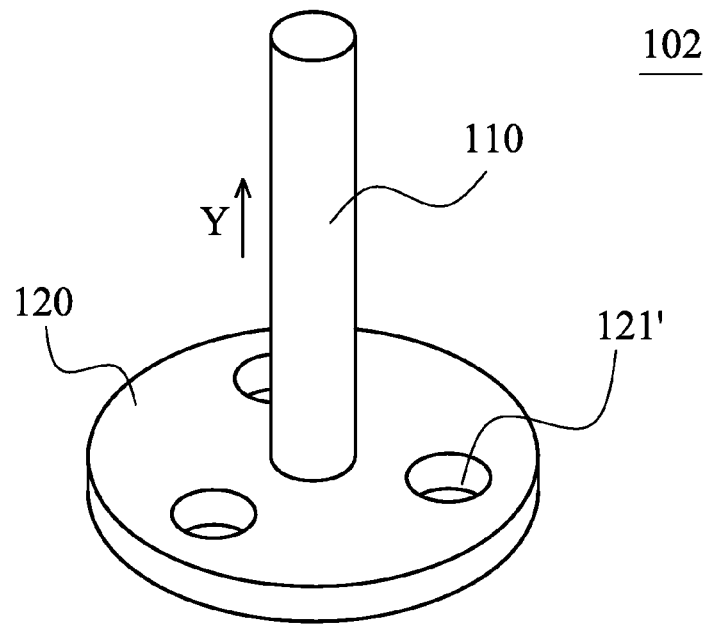
FIG. 4B is a perspective view of the pin of the second embodiment of the invention.

FIG. 4A is a top view of a pin 102 of a second embodiment of the invention. FIG. 4B is a perspective view of the pin 102 of the second embodiment of the invention. With reference to FIGS. 4A and 4B, in the second embodiment, the openings 121' are circular through holes, which surround the center of the base 120 equidistantly. Similarly, in this embodiment, the amount of the openings 121' is more than three, and the shape of the bottom surface of the base can be modified (for example, curved or irregular).

Figure 5A:
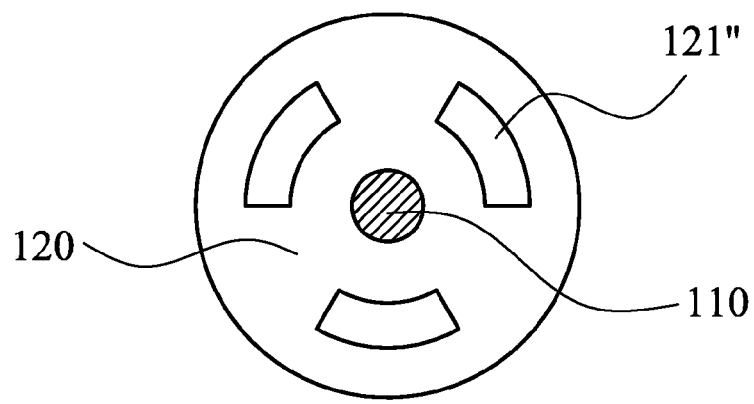
FIG. 5A is a top view of a pin of a third embodiment of the invention.
Figure 5B:
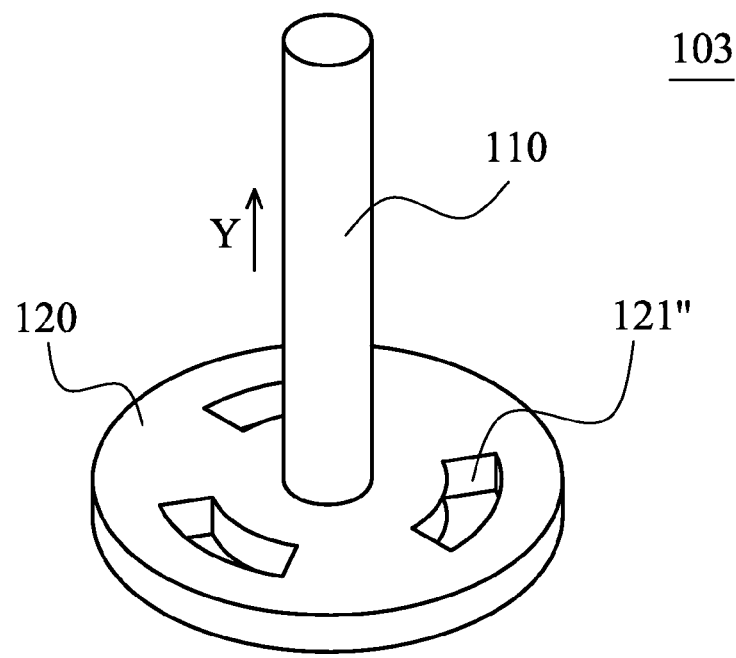
FIG. 5B is a perspective view of the pin of the third embodiment of the invention.

FIG. 5A is a top view of a pin 103 of a third embodiment of the invention. FIG. 5B is a perspective view of the pin 103 of the third embodiment of the invention. With reference to FIGS. 5A and 5B, in the third embodiment, the openings 121" are fan-shaped through holes, which surround the center of the base 120 equidistantly. Similarly, in this embodiment, the amount of the openings 121" is more than three, and the shape of the bottom surface of the base can be modified (for example, curved or irregular).

Figure 6A:
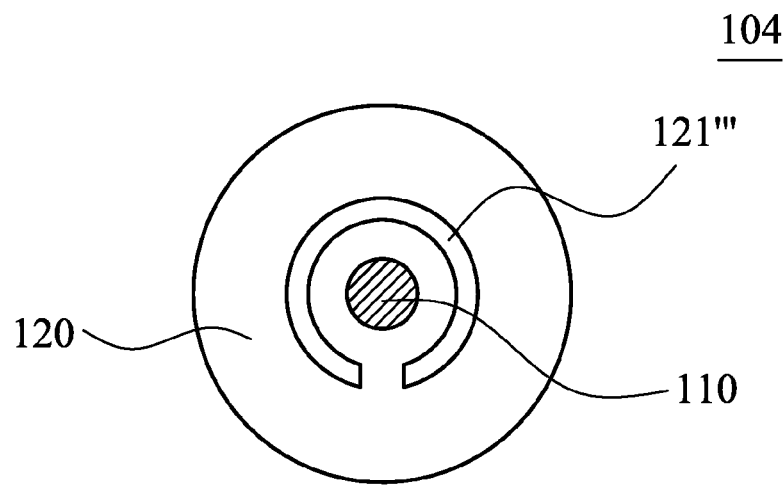
FIG. 6A is a top view of a pin of a fourth embodiment of the invention.
Figure 6B:
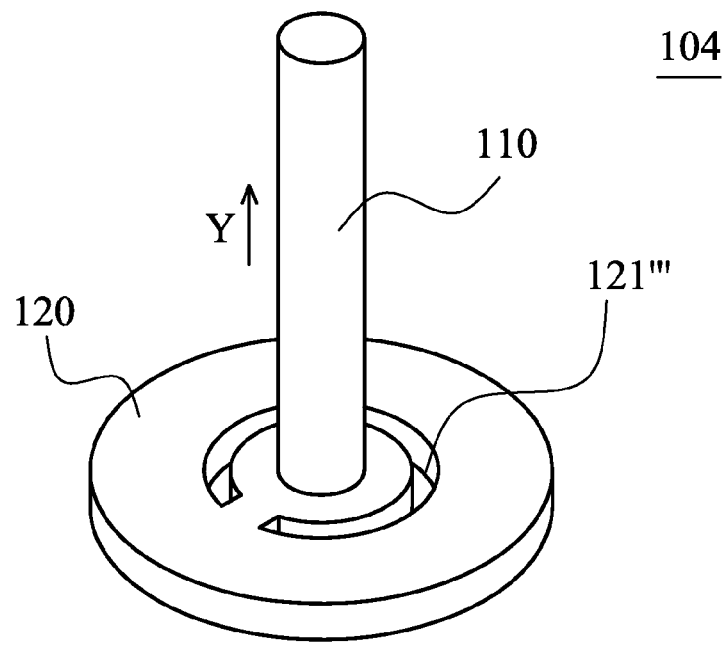
FIG. 6B is a perspective view of the pin of the fourth embodiment of the invention.

FIG. 6A is a top view of a pin 104 of a fourth embodiment of the invention. FIG. 6B is a perspective view of the pin 104 of the fourth embodiment of the invention. With reference to FIGS. 6A and 6B, in the fourth embodiment, the openings 121'" is an annular slot, which surrounds the center of the base 120. Similarly, in this embodiment, the shape of the bottom surface of the base can be modified (for example, curved or irregular).

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
a circuit board, comprising a substrate and a plurality of electrodes formed in the substrate, wherein a plurality of blind holes are formed on the circuit board and the electrodes are respectively located in the blind holes;
a soldering material, disposed on the electrodes inside the blind holes; and
a plurality of pins, inserted into the blind holes, contacting the soldering material and electrically connecting to the electrodes, wherein at least one of the pins comprises:
a post, having a fixing end; and
a base, disposed on the fixing end of the post, wherein a plurality of openings are formed on the base, passing through the base along an axis, and the axis is parallel to the post.

2. The electronic device as claimed in claim 1, further comprising a conductive pad, sandwiched between the soldering material and the electrodes.

3. The electronic device as claimed in claim 2, wherein the base comprises a bottom surface, the bottom surface contacts the conductive pad, and the soldering material contacts the inner walls of the openings.

4. The electronic device as claimed in claim 3, wherein the bottom surface is planar.

5. The electronic device as claimed in claim 3, wherein the bottom surface is curved.

6. The electronic device as claimed in claim 3, wherein the bottom surface is irregular.

7. The electronic device as claimed in claim 3, wherein the base further comprises a top surface, and the fixing end of the post is connected to the top surface.

8. The electronic device as claimed in claim 1, wherein shape of the base is circular.

9. The electronic device as claimed in claim 8, wherein an amount of the openings is three.

10. The electronic device as claimed in claim 9, wherein the openings are semicircular notches, and the openings are equidistantly formed on edge of the base.

11. The electronic device as claimed in claim 9, wherein the openings are circular through holes, and the openings are equidistantly surrounding a center of the base.

12. The electronic device as claimed in claim 9, wherein the openings are fan-shaped through holes, and the openings are equidistantly surrounding a center of the base.

13. The electronic device as claimed in claim 1, wherein the shape of the base is dish shaped.

14. An electronic device, comprising:
a circuit board, comprising a substrate and a plurality of electrodes formed in the substrate, wherein a plurality of blind holes are formed on the circuit board and the electrodes are respectively located in the blind holes;
a soldering material, disposed on the electrodes inside the blind holes; and
a plurality of pins, inserted into the blind holes, contacting the soldering material and electrically connecting to the electrodes, wherein at least one of the pins comprises:
a post, having a fixing end; and
a base, disposed on the fixing end of the post, wherein an opening is formed on the base, passing through the base along an opening axis, the opening axis is coaxial with an axis of the post, and the opening is a annular slot surrounding a center of the base.

* * * * *